(12) United States Patent
Cashman

(10) Patent No.: US 8,860,460 B1
(45) Date of Patent: Oct. 14, 2014

(54) PROGRAMMABLE INTEGRATED CIRCUITS WITH REDUNDANT CIRCUITRY

(71) Applicant: Altera Corporation, San Jose, CA (US)

(72) Inventor: David Cashman, Toronto (CA)

(73) Assignee: Altera Corporation, San Jose, CA (US)

( * ) Notice: Subject to any disclaimer, the term of this patent is extended or adjusted under 35 U.S.C. 154(b) by 94 days.

(21) Appl. No.: 13/669,244

(22) Filed: Nov. 5, 2012

(51) Int. Cl.
*H03K 19/177* (2006.01)

(52) U.S. Cl.
USPC .............................................. 326/41; 326/38

(58) Field of Classification Search
USPC ................................ 326/38–41; 716/117, 128
See application file for complete search history.

(56) References Cited

U.S. PATENT DOCUMENTS

| | | | |
|---|---|---|---|
| 6,148,390 A * | 11/2000 | MacArthur et al. | 712/37 |
| 6,201,404 B1 * | 3/2001 | Reddy et al. | 326/10 |
| 6,344,755 B1 * | 2/2002 | Reddy et al. | 326/10 |
| 6,965,249 B2 | 11/2005 | Lane et al. | |
| 7,180,324 B2 * | 2/2007 | Chan et al. | 326/10 |
| 7,215,140 B1 * | 5/2007 | Saini et al. | 326/41 |
| 7,622,952 B1 | 11/2009 | Lim et al. | |
| 7,644,386 B1 * | 1/2010 | Chan et al. | 716/128 |
| 8,174,284 B1 * | 5/2012 | Lewis | 326/10 |
| 8,191,025 B1 * | 5/2012 | Chan et al. | 716/117 |
| 8,362,800 B2 * | 1/2013 | Or-Bach et al. | 326/12 |

* cited by examiner

*Primary Examiner* — Vibol Tan
(74) *Attorney, Agent, or Firm* — Treyz Law Group; Jason Tsai

(57) ABSTRACT

Integrated circuits with repairable logic regions are provided. Each logic region may be organized into a predetermined number of rows of logic circuitry, one of which serves as a spare row. A repairable region may be operable in normal mode or redundant mode. In normal mode, the spare row is deactivated. When one of the logic region rows contains defective circuitry, that logic region is operated in redundant mode so that each row below the bad row is shifted down by one row and the spare row is engaged to serve as the last row to repair that region. Each row may include a multiplexer and an associated driver that drives a corresponding vertical routing segment from one row to the next. Each vertical routing segment has the option of being driven by its logically equivalent vertical wire in the immediate preceding row by configuring the corresponding multiplexer.

18 Claims, 12 Drawing Sheets

PROGRAMMABLE INTEGRATED CIRCUITS WITH REDUNDANT CIRCUITRY

BACKGROUND

This invention relates to integrated circuits, and more particularly, to programmable integrated circuits.

Programmable integrated circuits contain programmable logic that may be programmed to implement a desired custom logic design and are therefore sometimes referred to as programmable logic devices (PLDs). Programmable logic device integrated circuits may also contain redundant circuitry. Redundant circuitry can be used to repair a programmable logic device that contains a defect, thereby improving production yield.

A programmable logic device is typically organized into logic regions. Each of the logic regions on a programmable logic device includes multiple rows of logic and one spare row of logic. When one row in a logic region is determined to be defective (assuming the bad row is not the spare row), the spare row in that logic region is engaged so that each row from the spare row to the row immediately below the bad row replaces the row immediately preceding that that row (i.e., each row below the bad row is replaced by the row immediately below that row). Such types of row-based redundancy schemes are described, for example, in commonly assigned U.S. Pat. No. 6,965,249 and U.S. Pat. No. 7,180,324, incorporate by reference herein in their entireties.

Conventional row-based redundancy schemes often rely on the use of vertical wires to interconnect the different rows in each logic region. Each of the vertical wires typically spans multiple rows and has a distal terminal that is either connected to circuitry in a first target row or a second target row. If a given vertical wire does not traverse a broken row, that given vertical wire will be connected to the first target row. If the given vertical wire traverses a broken row, all routing connections below the broken row will be shifted down by one row so that the given vertical wire is connected to the second target row. Redundancy schemes implemented using vertical wires that span multiple rows and that are directly connected to routing circuitry in two target rows require undesirable amounts of wiring and area overhead.

SUMMARY

A programmable integrated circuit is provided that includes multiple repairable logic regions. Each repairable logic region may have a group of normal rows of logic circuitry and a spare row of logic circuitry. Each row of logic circuitry in a repairable region may include a bypass circuit (e.g., a multiplexing circuit) and an associated driver that is used to drive signals onto a corresponding vertical routing segment.

Each vertical routing segment (sometimes referred to as a vertical signal routing path) may have a first terminal that is coupled to a respective one of the rows of logic circuitry and a second terminal that is coupled to an adjacent one of the rows of logic circuitry. The amount of logic circuitry in each of the rows in the group of normal rows and the spare row may be substantially identical. The spare row of logic circuitry may be formed within a given height. Each vertical routing segment may have a length that is less than or equal to the given height of the spare row.

Each repairable logic region may be operable in normal mode or redundant mode. If each of the normal rows in a repairable logic region is free of defects, that repairable logic region may be operated in normal mode (i.e., by placing the spare row in idle mode). If more than one normal row in the repairable logic region contains defective circuits, that logic region may be marked as irreparable and the integrated circuit may be discarded. If only one of the normal rows contains a defective circuit, that logic region may be repaired by operating the logic region in redundant mode.

During redundant mode, the bypass circuits may be configured to switch the spare row into use. In particular, the vertical routing segment that is output from the defective row may be driven by another vertical routing segment that is received by the bad row using the bypass circuit in the bad row. The bypass circuit in the bad row has to be functional in order to properly route signals through the defective row. If the bypass circuit and the associated driver in the bad row are also defective, the programmable integrated circuit should be discarded. The bypass circuit in the bad row may be configured using a fuse-based storage element that is selectively blown so that the bypass circuit is permanently set to bypass the defective row.

Each of the normal rows and the spare row in a logic region may include a multiplexer having at least a first input that is coupled to a corresponding vertical routing segment and a second input that is coupled to at least one other vertical routing path routed from a non-adjacent row (e.g., the other vertical routing path may have a length that greater than the given height of the spare row and may therefore span more than one row).

During design of a programmable device of this type, computer-aided design (CAD) tools stored on a non-transitory computer-readable storage media may be used to simulate the performance of the programmable device. In particular, it may be desirable to performing timing analysis on critical signal routing paths. A critical signal routing path may originate from a given row of logic in a selected one of the logic regions on the programmable device, where the critical routing path is formed from multiple vertical routing segments.

In a first scenario in which the critical routing path is an intra-region critical routing path (i.e., in which the critical routing path only carries signals within the selected one of the logic regions), the CAD tools may be used to identify a critical row boundary separating a pair of adjacent rows exhibiting a greatest (maximum) number of vertical wire routing segment crossings. The CAD tools may then compute a routing delay for the critical routing path by determining the length of the critical routing path (e.g., by counting the number of vertical and horizontal routing segments interposed in the critical routing path). The CAD tools may then compute a worst case routing delay for the critical path by adding to the routing delay additional vertical routing delay that is proportional to the number of times that the critical routing path crosses the critical row boundary (e.g., to take into account the worst case scenario in which the row following the critical row boundary is a defective row).

In another suitable scenario in which the critical routing path is an inter-region critical routing path (i.e., in which the critical routing path carries signals from one logic region to another), the CAD tools may be used to separately compute the worst case routing delay for the portion of the critical routing path in each logic region that includes the critical routing path. In other words, the CAD tools may be used to identify the number of vertical wire crossings at the critical row boundary in every logic region 100 that the critical path traverses.

Each time the critical path traverses a critical row boundary, an additional unit of vertical routing delay may be incurred to take into account worst case scenario that the row following the critical row boundary is defective. The worst case timing delay can therefore be determined by separately computing the worst case delay for each region that includes the critical path, and then subsequently summing the separately computed delay to obtain the total worst case delay for the inter-region critical path. Information gathered using the CAD tools in this way may be used to determine whether the worst case routing delay for the critical routing path satisfies performance criteria.

Further features of the present invention, its nature and various advantages will be more apparent from the accompanying drawings and the following detailed description.

DETAILED DESCRIPTION

Embodiments of the present invention relate to integrated circuits with redundant circuitry. The integrated circuits may be any suitable type of integrated circuit, such as microprocessors, application-specific integrated circuits, digital signal processors, memory circuits, or other integrated circuits. If desired, the integrated circuits may be programmable integrated circuits that contain programmable circuitry. The present invention will generally be described in the context of integrated circuits such as programmable logic device (PLD) integrated circuits as an example.

Figure 1:
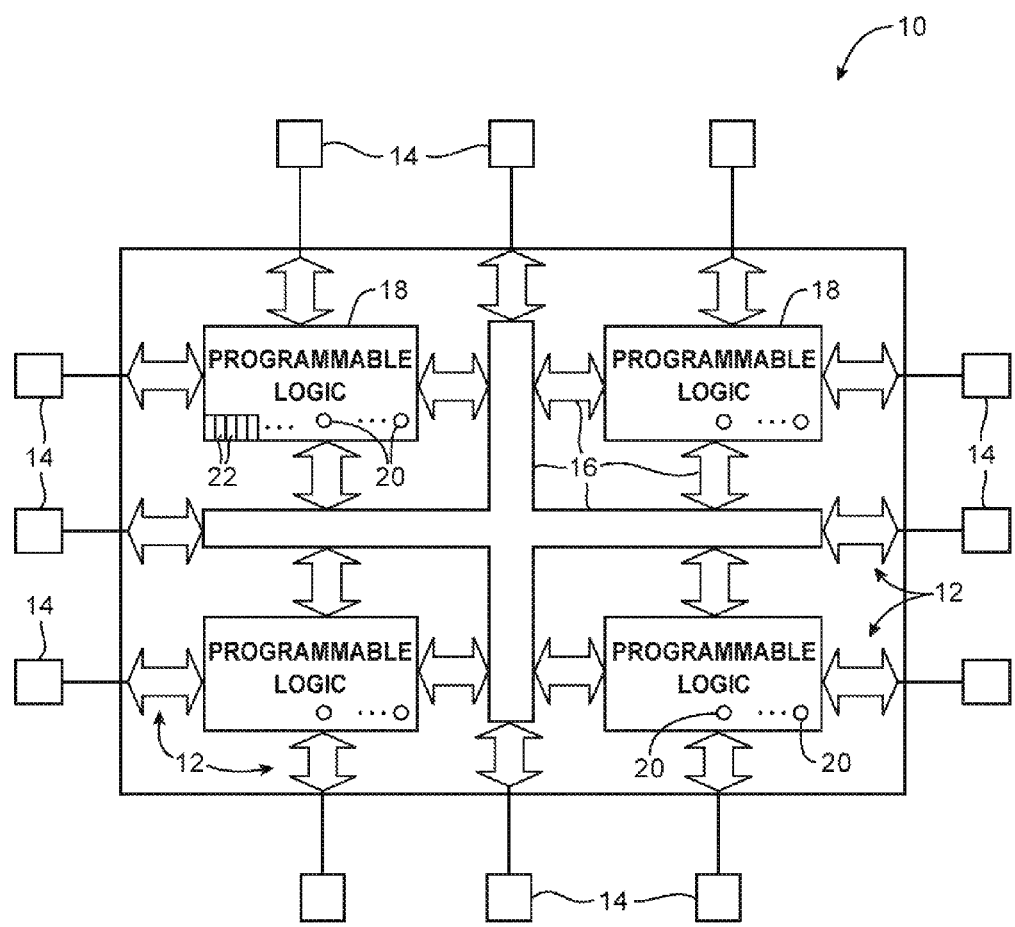
FIG. 1 is a diagram of an illustrative programmable integrated circuit in accordance with an embodiment of the present invention.

FIG. 1 is a diagram of an illustrative integrated circuit such as a programmable integrated circuit 10. Programmable device 10 may include input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include conductive lines and programmable connections between respective conductive lines and are therefore sometimes referred to as programmable interconnects 16.

Programmable device 10 may include programmable logic 18 that can be configured to perform a custom logic function. Programmable logic 18 may include combinational and sequential logic circuitry. The programmable interconnects 16 may be considered to be a type of programmable logic 18.

Device 10 may also contain programmable memory elements 20. Memory elements 20 can be loaded with configuration data (also called programming data) using pins 14 and input-output circuitry 12. Once loaded, the memory elements may each provide a corresponding static control signal that controls the operation of an associated logic component in programmable logic 18. In a typical scenario, the outputs of the loaded memory elements 20 are applied to the gates of metal-oxide-semiconductor transistors in programmable logic 18 to turn certain transistors on or off and thereby configure the logic in programmable logic 18 and routing paths. Programmable logic circuit elements that may be controlled in this way include pass transistors, parts of multiplexers (e.g., multiplexers used for forming routing paths in programmable interconnects 16), look-up tables, logic arrays, various logic gates, etc.

Memory elements 20 may be implemented using any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 20 are loaded with configuration data during programming, memory elements 20 are sometimes referred to as configuration memory, configuration RAM (CRAM), or programmable memory elements.

The circuitry of device 10 may be organized using any suitable architecture. As an example, the logic of device 10 may be organized in a series of rows and columns of larger programmable logic regions each of which contains multiple smaller logic regions. The smaller regions may be, for example, regions of logic that are sometimes referred to as logic elements (LEs), each containing a look-up table (LUT), one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (as an example). The larger regions may be, for example, logic array blocks (LABs) containing multiple logic elements or multiple ALMs. In the example of FIG. 1, illustrative logic regions 22 (which may be, for example, LEs or ALMs) are shown in one of the larger regions of programmable logic 18 in FIG. 1 (which may be, for example, a logic array block). In a typical programmable logic device 10, there may be hundreds or thousands of smaller logic regions 22. The logic regions 22 that are shown in FIG. 1 are merely illustrative.

During device programming, configuration data is loaded into device 10 that configures the programmable logic regions 22 and programmable logic regions 18 so that their logic resources perform desired logic functions on their inputs and produce desired output signals. For example, CRAM cells are loaded with appropriate configuration data bits to configure adders and other circuits on device 10 to implement desired custom logic designs.

The resources of device 10 such as programmable logic 18 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic array blocks or other such logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Programmable integrated circuit 10 may have redundant circuitry. Integrated circuits with redundant circuitry can be repaired during manufacturing.

Integrated circuits are manufactured using complex semiconductor fabrication techniques. One figure of merit when producing integrated circuits is a circuit's manufacturing yield. Circuits that are extremely complex or that are fabricated using cutting-edge processes are generally more difficult to produce without faults than more established circuit designs. As a result, manufacturing yields for newer and more complex circuits are sometimes lower than the manufacturing yields of older designs. Yields can also be negatively affected when designing high performance chips, because devices of this type contain smaller line widths and more complex structures, making them more difficult to manufacture.

Poor manufacturing yields can adversely affect the profitability of an integrated circuit design. In some situations, yields may be so low as to make volume production unfeasible. It is therefore desirable to enhance manufacturing yields whenever possible. This can make otherwise unprofitable integrated circuits economical to manufacture. Enhanced yields can also improve profit margins for integrated circuits that are already profitable.

Although it is beneficial to enhance manufacturing yields whenever possible, it is generally not desirable to do so at the expense of performance or die size. Increases in yield that are achieved through the use of increased die sizes or less aggressive manufacturing techniques may not be acceptable in the marketplace due to issues such as poor power consumption and poor switching speeds. Increasing die sizes, however, increases cost, which may offset benefits from improved yield.

One way to improve manufacturing yields while maintaining acceptable performance involves providing integrated circuits such as integrated circuit 10 with redundant circuitry. Following device fabrication, a newly fabricated integrated circuit can be tested. If a defect is detected, circuitry on integrated circuit 10 may be configured to bypass the defect. In doing so, spare circuitry can be switched into use in place of the bypassed defect.

This type of redundancy scheme can help to improve manufacturing yields. Integrated circuits 10 that would otherwise need to be scrapped can be salvaged and sold to customers. The repair process need not adversely affect device performance, so repaired devices may operate just as well as devices in which no defects were detected. There is usually a limited number of defects on a given integrated circuit 10, so it is generally not necessary to provide a large amount of redundant circuitry. Because only a relatively small amount of redundant circuitry is provided, the increased die area and performance penalties associated with providing redundancy are typically outweighed by the considerable economic benefits that result from achieving enhanced manufacturing yields.

Figure 2:
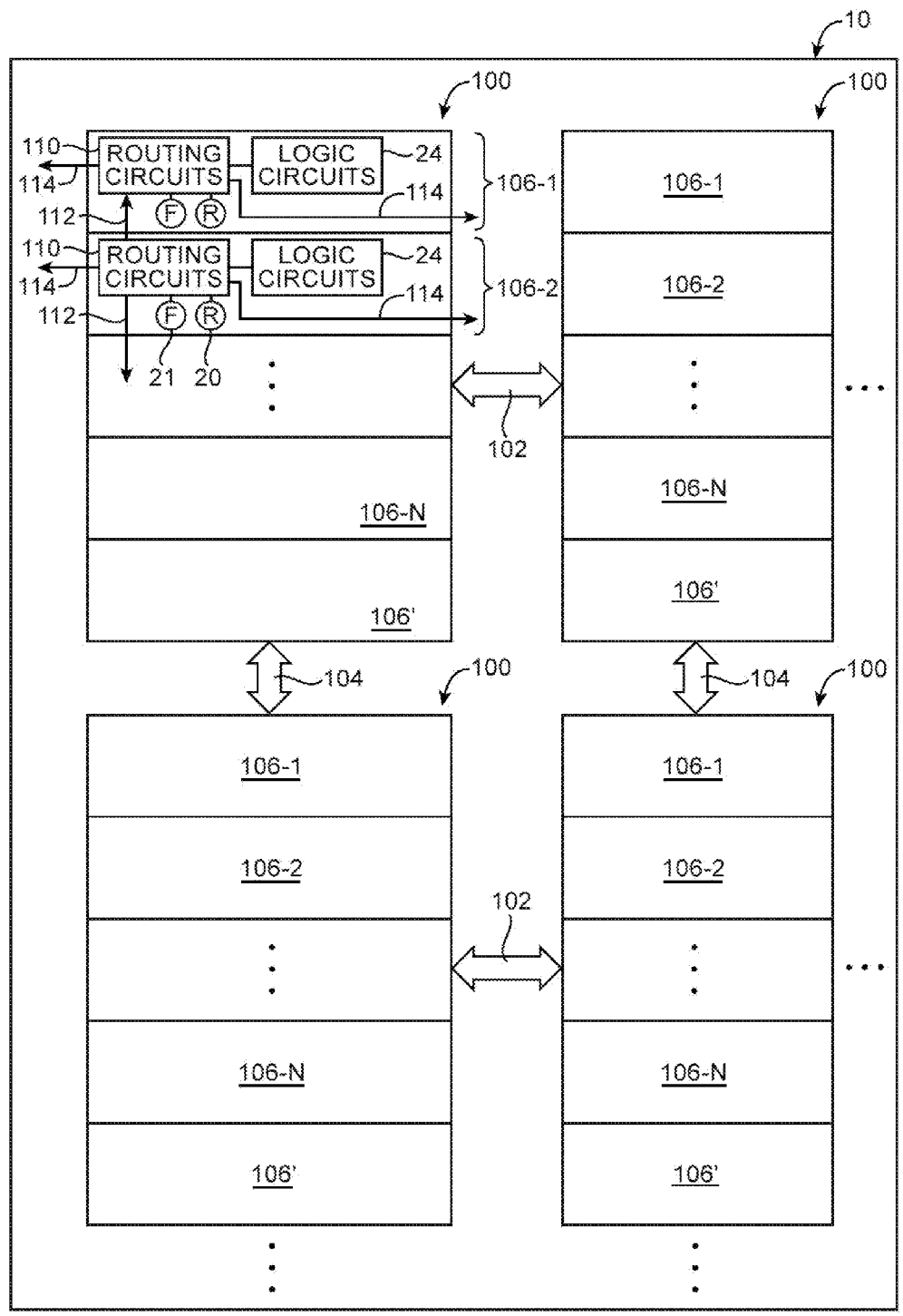
FIG. 2 is diagram of an illustrative programmable integrated circuit having multiple repairable logic regions in accordance with an embodiment of the present invention.

An integrated circuit 10 with redundant circuitry in accordance with an embodiment of the present invention is shown in FIG. 2. As shown in FIG. 2, integrated circuit 10 (e.g., a programmable logic device integrated circuit) may have programmable logic circuitry organized into multiple repairable regions 100. Each repairable region 100 may, for example, include N rows of normal logic circuitry 106 (i.e., first normal row 106-1, second normal row 106-2, . . . , $N^{th}$ normal row 106-N) and one spare row 106'. As an example, each row 106 may include multiple LABs, dedicated multiplier blocks, embedded random-access memory, and other control circuitry. The amount and type of programmable logic provided in each of the (N+1) rows in a repairable region 100 may be identical for supporting redundancy schemes. Spare row 106' may generally be formed towards the edge of repairable region 100. In the example of FIG. 2, spare row 106' may be positioned at the bottom of each repairable region 100.

Repairable region 100 may be operable in a normal mode and a redundant mode. When all normal rows 106 in region 100 are able to function properly (i.e., when rows 106-1, 106-2, . . . , and 106-N do not contain defective circuitry), region 100 is placed in the normal mode while spare row 106' is switched out of use (e.g., in the normal mode, the N rows 106 can be configured to carry out desired logic functions while the spare row remains deactivated).

When one normal row 106 in region 100 contains a defect (i.e., when one of rows 106-1, 106-2, . . . , and 106-N contains a defective circuit), region 100 may be placed in the redundant mode by switching the bad row out of use and engaging the spare row 106' to repair region 100. For example, consider a scenario in which a given repairable region 100 contains 64 normal rows 106 and one spare row 106' and the $11^{th}$ row contains a manufacturing defect (i.e., row 106-11 contains defective circuitry). In this scenario, the first ten rows 106 (rows 106-1, 106-2, . . . , and 106-10) are unchanged, whereas the remaining rows in given region 100 below the bad row is shifted down by one so that the bad row is bypassed. In other words, row 106-12 will serve as a replacement for broken row 106-11, and each subsequent row will be replaced by the row immediately following that row while spare row 106' is used to replace row 106-64.

This example is merely illustrative. Spare row 106' may be used to repair region 100 of any size that includes at most one bad row. If desired, each repairable region 100 may include more than one spare row 106' to provide the capability of repairing region 100 that includes more than one broken row. Device 10 having repairable regions 100 with spare rows is said to implement row redundancy. In general, row redundancy and column redundancy configurations are interchangeable, because a row-redundancy scheme becomes a column-redundancy scheme when a circuit such as circuit 10 is rotated by 90°. Row redundancy schemes are sometimes described herein as an example.

Different repairable regions 100 arranged along the same row may communicate via programmable inter-region interconnect paths 102, whereas different repairable regions 100 arranged along the same column may communicate via programmable inter-region interconnect paths 104. Paths 102 and 104 may form part of the interconnection resources 16 as described in connection with FIG. 1. In general, device 10 may include any number of repairable regions 100 arranged in any suitable configuration.

Each row 106 in a repairable region 100 may include configurable routing circuits 110 and programmable logic circuits 24 (see, e.g., FIG. 2). Configurable routing circuits 110 may be controlled using static control bits provided from at least one user-configurable volatile memory element 20 (e.g., a CRAM cell loaded with configuration data) and/or from at least one nonvolatile memory element 21 (e.g., a fuse, anti-fuse, electrically-programmable read-only memory element, etc.). Routing circuits 110 may include switching circuitry and driver circuitry for routing and driving data and control signals along horizontal routing paths 114 (sometimes referred to as "H" lines) within a row 106 or between separate regions 100 via path 102 and for routing and driving data and control signals along vertical routing paths 112 (sometimes referred to as "V" lines) from one row to another or between separate regions 100 via path 104.

At least some of the data and control signals received at and output by a routing circuit 110 may be fed to the associated logic circuits 24 within the same row. Logic circuits 24 in each of the (N+1) rows may include any suitable number of configurable circuitry such as pass transistors, logic gates (e.g., logic NAND gates, logic NOR gates, inverters, etc.), switching circuits, multiplexing circuits, sequential and combinatorial logic circuits, lookup tables (LUTs), and storage components (e.g., registers) arranged into blocks sometimes referred to as logic array blocks (LABs), logic elements (LEs), adaptive logic modules (ALMs), or other suitable logic region portions.

Figure 3:
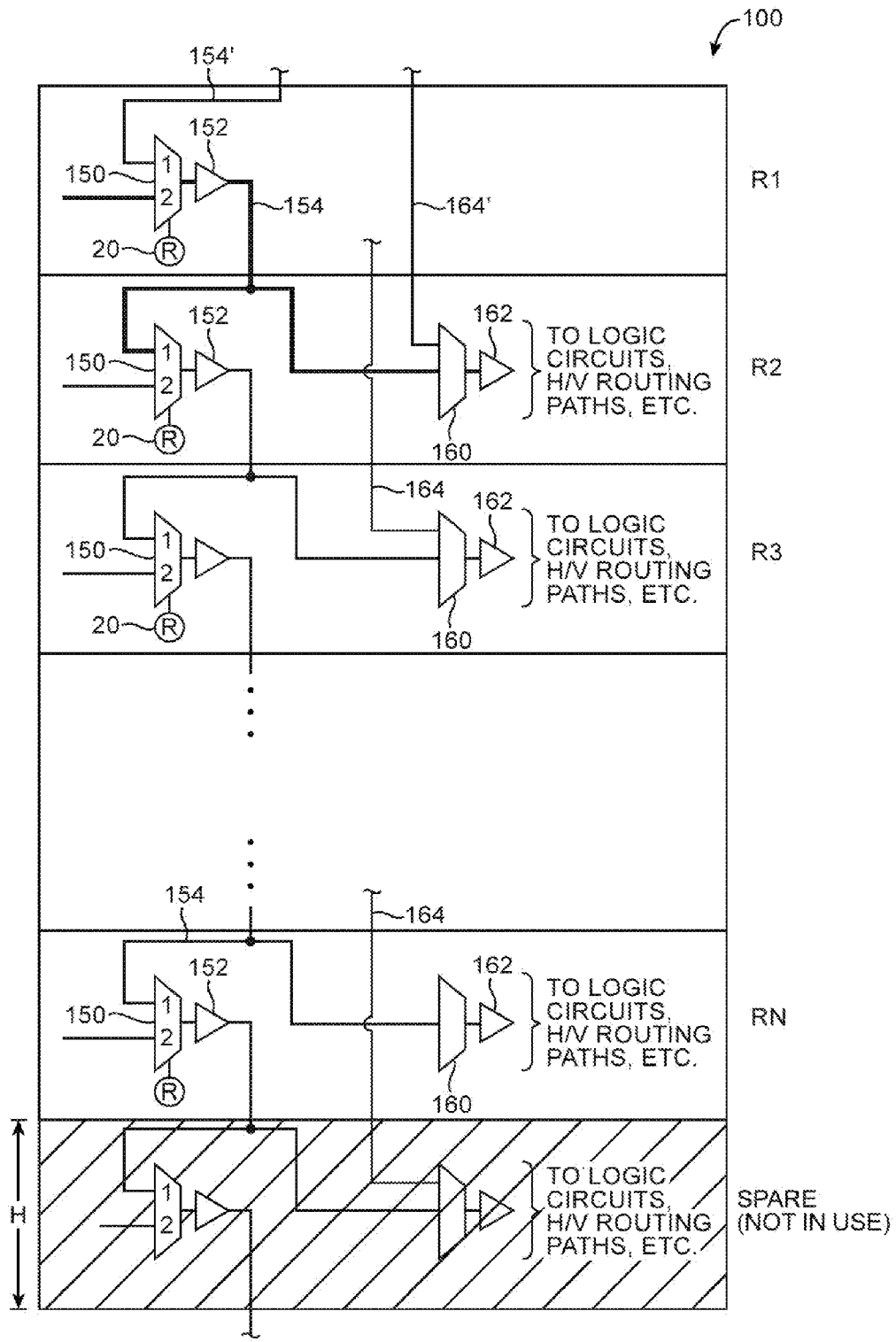
FIG. 3 is a diagram of an illustrative repairable logic region operating in normal mode in accordance with an embodiment of the present invention.

FIG. 3 shows one suitable embodiment of the present invention in which vertical wires that route signals from one row to another have lengths that are limited to the height of a single spare row. As shown in FIG. 3, repairable region 100 includes (N+1) identical logic rows (e.g., rows R1, R2, R3, . . . , RN, and a spare row). Each row may include a vertical line (V-line) routing input multiplexer 150, an driver 152 that is associated with multiplexer 150, another routing input multiplexer 160, a driver 162 that is associated with multiplexer 160, and other routing circuitry. Multiplexers 150 and 160 and the associated drivers may be considered to be part of routing circuits 110 (FIG. 2).

In particular, multiplexer 150 may have a first input that receives signals via a vertical routing path 154 that is coupled to the output of driver 152 in a previous row, a second input operable to receive user signals, a control input that receives static control bits from associated memory elements, and an output that is coupled to a corresponding driver 152. Driver 152 may be used to drive another vertical routing path 154 that is routed to a subsequent row. Vertical routing path 154 of FIG. 3 may be equivalent to the V-line 112 introduced in FIG. 2 and may have a uninterrupted physical length that is equal to or less than height H of a single row in repairable region 100. Each vertical routing wire 154 (sometimes referred to as a vertical routing "segment") interposed between two consecutive V-line routing input multiplexers 150 in a pair of adjacent rows has a length that is shorter than the row height H of a single spare row (the spare row of circuitry may be formed within row height H). In other words, each routing segment 154 has a first end that is coupled to circuitry in a respective one of the rows in region 100 and has an opposing second end that is coupled to circuitry in an adjacent one of the rows in that region 100 (e.g., each vertical routing segment 154 couples together multiplexers 150 that are formed in adjacent rows).

Multiplexer 160 may have an input that also receives signals via the vertical routing path 154 that is coupled to the output of driver 152 in the previous row, additional inputs that are coupled to vertical routing paths 164 having lengths that are substantially greater than the length of path 154 (i.e., vertical routing paths 164 that span more than a single row 106) using longer vertical routing wires from one of the other redundancy schemes as described in U.S. Pat. No. 6,965,249 and U.S. Pat. No. 7,180,324 (as examples), and an output that is coupled to a corresponding driver 162. Driver 162 may be used to drive signals onto logic circuits 24 within that row, horizontal routing lines 114 (see, FIG. 2), other vertical routing lines, input-output bus lines, or other suitable programmable circuitry.

Routing input multiplexers 150 and 160 within a given region 100 are not limited to receiving data and control signals via vertical wires within that region. In the example of FIG. 3, multiplexer 150 in the first row R1 may have its first input coupled to a vertical wire 154' routed from other circuitry that are not part of region 100 on device 10. Similarly, routing input multiplexers 160 in one of the top rows in region 100 may have inputs that are coupled to vertical wires 164' that are routed from other components external to that region 100 on device 10.

FIG. 3 illustrates region 100 operating in normal mode when none of normal rows R1-RN in region 100 contains a manufacturing defect. During normal mode, the spare row is not in use and may optionally be powered down to conserve power. Each routing input multiplexer 150 in the remaining N rows may be controlled by static control bits provided from user-configured memory elements 20 (e.g., storage elements that are loaded with configuration data) to either route signals from its first input to its output or to route signals from its second input to its output.

As shown by the bolded path of FIG. 3, multiplexer 150 in row R1 may be configured to route user signals from its second input to its output so that the user signals are driven onto the corresponding vertical routing segment 154 via associated driver 152. These signals are then fed to subsequent row R2 via segment 154 for further processing. Generally, signals provided at the output of vertical wire routing input multiplexer 150 during normal mode may be received by multiplexer 160 in a subsequent row for further routing (assuming the subsequent row is not the spare row), and multiplexer 150 in the subsequent row can potentially be configured by the user to route user signals from its second input to its output.

Figure 4:
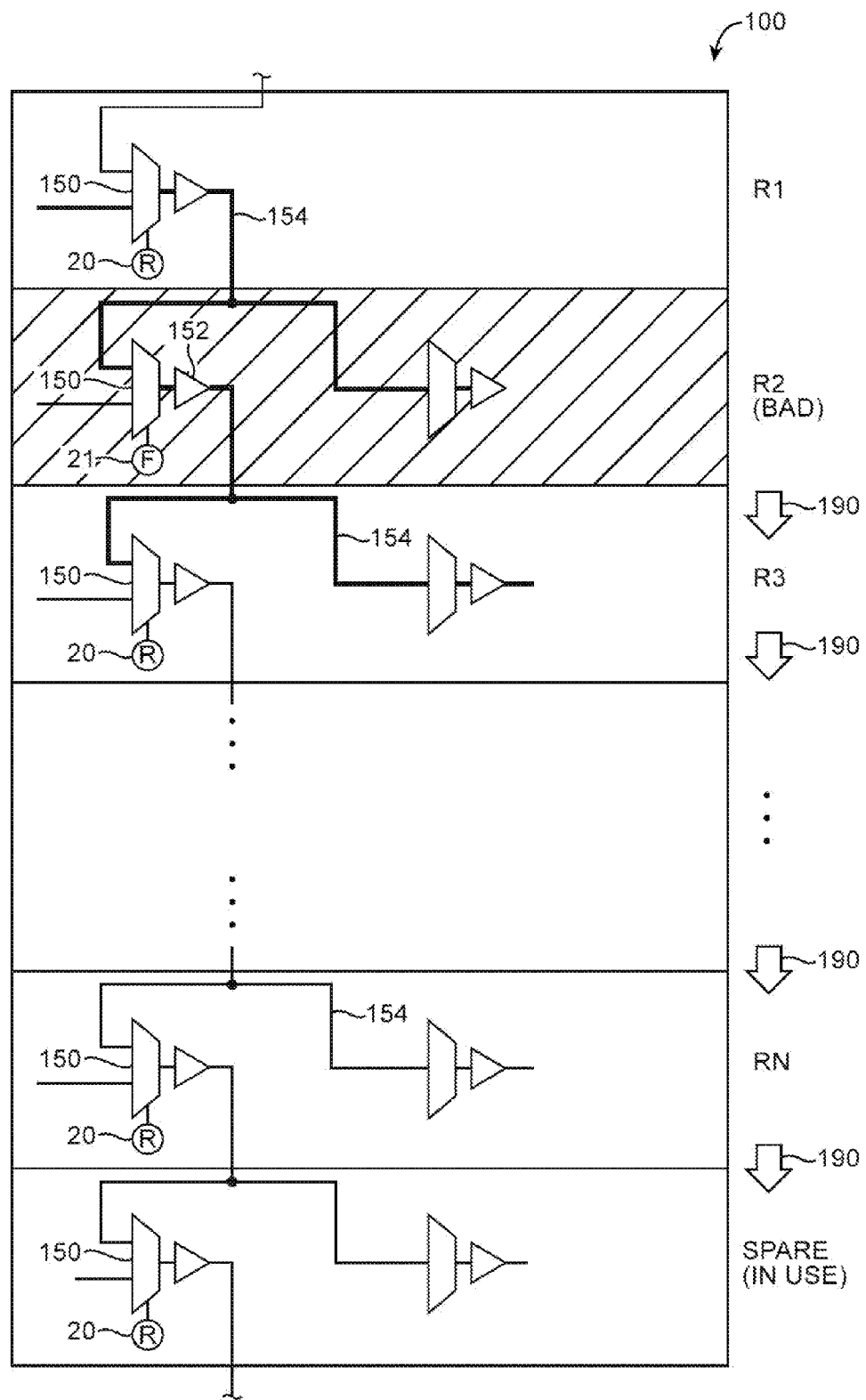
FIG. 4 is a diagram of an illustrative repairable logic region operating in redundant mode in accordance with an embodiment of the present invention.

FIG. 4 shows repairable region 100 operating in redundant mode when one of rows R1-RN in region 100 contains defective circuitry. During redundant mode, the broken row is bypassed and the spare row is switched into use. As shown in the example of FIG. 4, row R2 is determined to be a broken row. As a result, an associated non-volatile memory element such as fuse 21 may be selectively blown such that vertical line routing input multiplexer 150 in R2 is permanently set to route signals from its first input to its output. The associated driver 152 in R2 may then drive this output signal onto corresponding vertical routing segment 154 that is routed to row R3. In other words, when a vertical routing wire 154 arrives at a broken row, that incoming vertical routing wire is shorted to the equivalent vertical routing wire in the broken row and is routed out to the functional row immediately below the broken row. Multiplexer 160, logic circuits 24, and other input routing circuitry in the bad row (i.e., row R2) may be switched out of use or optionally deactivated to reduce power consumption. In this example, multiplexer 150, driver 152, and the associated vertical routing wires must be free of manufacturing defects in order for this bypassing scheme to operate successfully (e.g., multiplexer 150, driver 152, and the associated vertical routing lines in the bad row must still be able to properly propagate signals for device 10 to be considered repairable).

As indicated by arrows 190, each successive row below the bad row may be shifted down by one row such that each outgoing vertical wire 154 is replaced by its logically equivalent vertical wire 154 in the immediate preceding row (e.g., so that rows R3, R4, . . . , RN, and the spare row serve to replace rows R2-RN that would have otherwise been used if row R2 was not defective). This shifting of rows may be invisible to a user of device 10 since the user only cares that there are N functional logic rows in region 100. Configuring multiplexer 150 in the defective row in this way can therefore be used to effectively bypass the defective row by shifting each row below the broken row down one row so that each shifted row serves to replace the row immediately above that shifted row. Multiplexers 150 are therefore sometimes referred to as bypass circuits.

The example of FIG. 4 in which vertical wires 154 are carrying signals "downstream" (i.e., from R1 to R2, from R2 to R3, and so on) is merely illustrative. In other suitable arrangements, region 100 may include additional multiplexers 150 and associated drivers 152 for driving signals "upstream" (i.e., from the spare row to RN, from RN to RN−1 and so on). In the downstream vertical routing path, every vertical wire should have the option of being driven by its logically equivalent vertical wire in the row immediately above, whereas in the upstream vertical routing path, every vertical wire should have the option of being driven by its logically equivalent vertical wire in the row immediately below. The example of FIG. 4 illustrates merely one set of downstream vertical routing circuitry. In general, each region 100 on device may include more than one set of downstream vertical routing circuitry and more than one set of upstream vertical routing circuitry.

Figure 5:
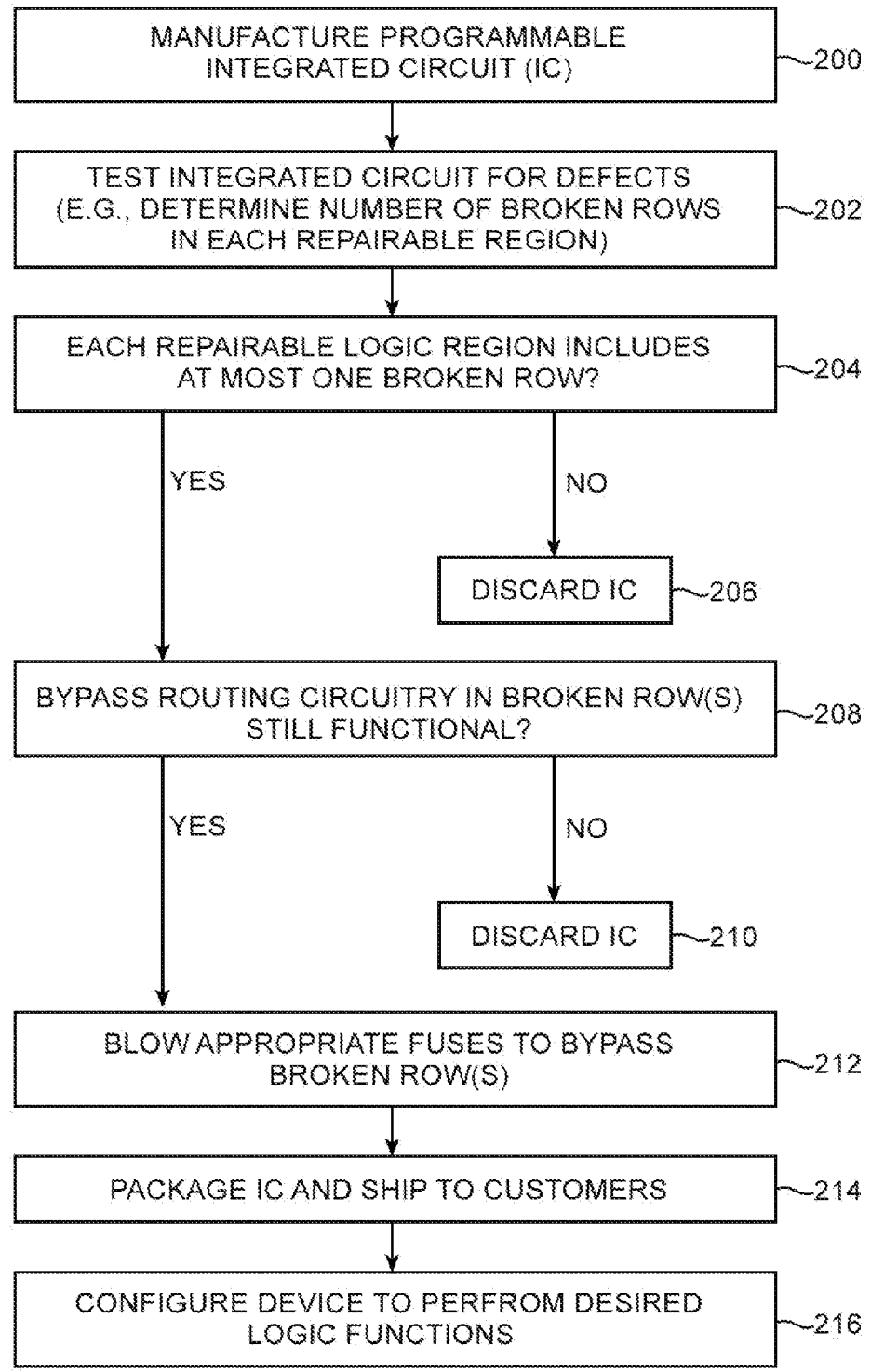
FIG. 5 is a flow chart of illustrative steps for manufacturing, testing, and packaging a programmable integrated circuit in accordance with an embodiment of the present invention.

FIG. 5 is a flow chart of illustrative steps involved in identifying dies with defective circuitry and in determining whether to repair the faulty die. At step 200, a programmable integrated circuit die 10 may be manufacturing at a semiconductor fabrication facility as part of an integrated circuit wafer. At step 202, die 10 may be tested for defects to determine the number of broken rows in each repairable region 100.

In the scenario that at least one repairable region 100 on die 10 contains more than one broken row, that die 10 is marked as irreparable and is discarded. In the scenario that each repairable region 100 on die 10 contains at most one broken row, that die 10 is repairable and processing can proceed to step 208.

At step 208, die 10 may be tested to determine whether multiplexer 150, driver 152, and the associated vertical routing lines (referred to sometimes collectively as bypass routing circuitry) in the broken row in each of the repairable regions 100 is still properly functional. If the bypass routing circuitry in the broken row(s) is defective (i.e., if the bypass routing circuitry is incapable of propagating signals from a previous row to a subsequent row), that die 10 is marked as irreparable and should be discarded. If the bypass routing circuitry in the broken row(s) is free of defects, that die 10 is repairable and processing can proceed to step 212.

At step 212, the appropriate fuse elements 21 may be blown so that multiplexers 150 in the broken rows are permanently set to bypass mode (e.g., so that vertical routing segment 154 in the broken row is driven by its logically equivalent vertical wire in the row immediately preceding the broken row).

At step 214, device 10 may be diced and packaged into an individual integrated circuit component and then shipped to customers. The customers can then configure device 10 by loading device 10 with user configuration data that configures device 10 to perform the desired logic functions. From the customer's perspective, each logic region 100 on device 10 includes N functional rows (e.g., the customer does not care which row is broken and bypassed, if any, as long as there are N available rows of programmable logic resources for use in performing the desired application).

Figure 6:
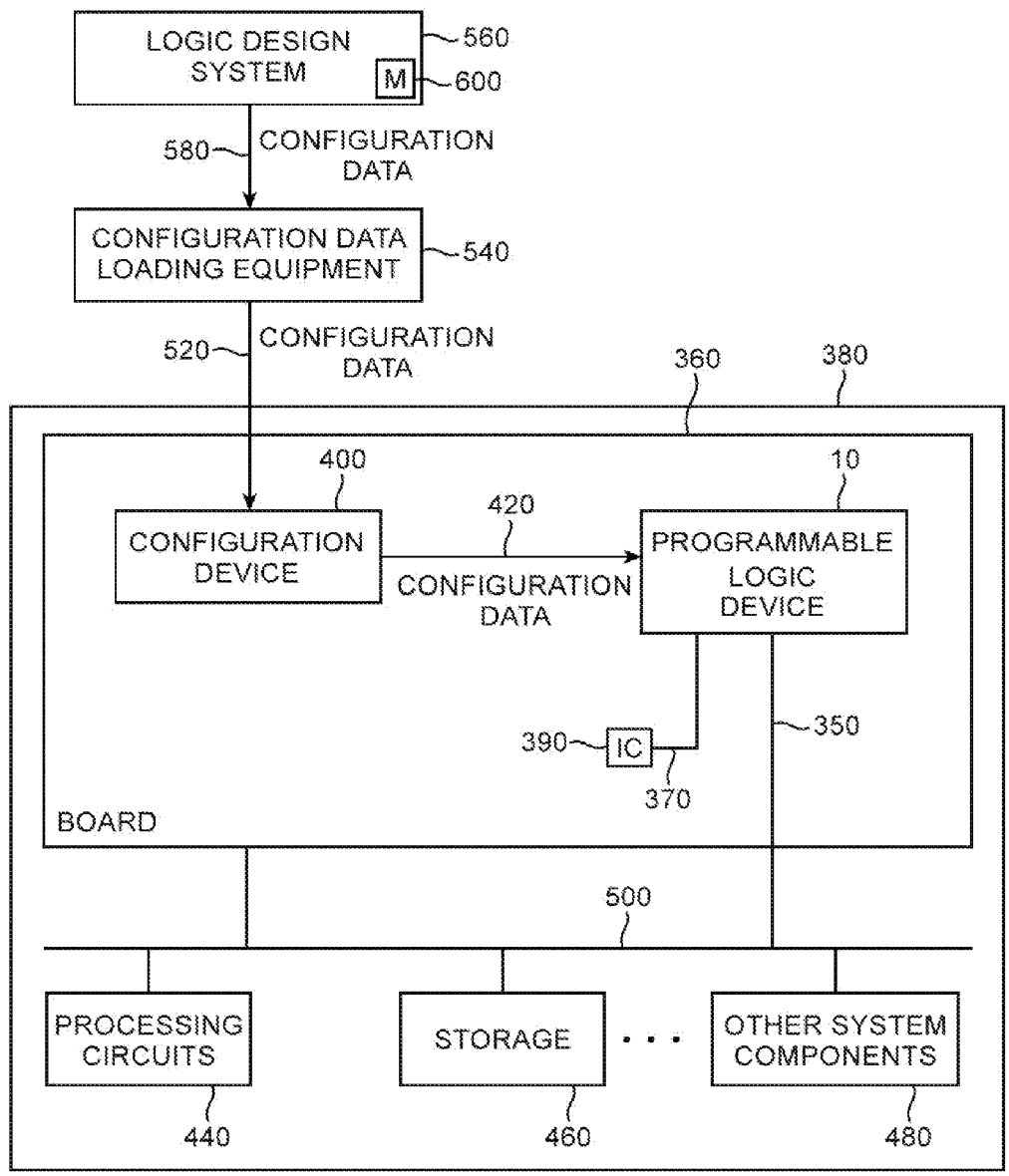
FIG. 6 is a diagram of an illustrative system environment in which a programmable integrated circuit may be configured using a logic design system in accordance with an embodiment of the present invention.

An illustrative system environment for designing and configuring a programmable integrated circuit 10 is shown in FIG. 6. Device 10 may be mounted on a board 360 in a system 380. Device 10 may receive configuration data from programming equipment or from any other suitable equipment or device.

In the example of FIG. 6, device 10 is a type of programmable integrated circuit that receives configuration data from an associated integrated circuit 400. With this type of arrangement, circuit 400 may, if desired, be mounted on the same board 36 as device 10. Circuit 400 may be a programmable logic device configuration data loading chip that loads configuration data into programmable logic device memory from an external electrically erasable-programmable read-only memory (EEPROM) chip, a programmable logic device configuration data loading chip with built-in memory (sometimes referred to as a configuration device), or any other suitable device. When system 380 boots up (or at another suitable time), the configuration data may be supplied to device 10 from device 400, as shown schematically by path 420. The configuration data that is supplied to device 10 may be stored in its programmable elements 20 (e.g., configuration random-access-memory elements).

System 380 may include processing circuits 440, storage 460, and other system components 480 that communicate with device 10. The components of system 380 may be located on one or more boards such as board 360 or other suitable mounting structures or housings.

Communication paths may be used to interconnect device 10 to other components. For example, communication path 370 may be used to convey data between an integrated circuit 390 that is mounted on board 360 and device 10. Communication paths 350 and 500 can be used to convey signals between device 10 and components 440, 460, and 480.

Configuration device 400 may be supplied with the configuration data for device 10 over a path such as path 520. Configuration device 400 may, for example, receive the configuration data from configuration data loading equipment 540 or other suitable equipment that stores the configuration data in configuration device 400. Device 400 may be loaded with data before or after installation on board 360.

It can be a significant undertaking to design and implement a desired logic circuit in a programmable logic device. Logic designers therefore generally use logic design systems based on computer-aided-design (CAD) tools to assist them in designing circuits. A logic design system (sometimes referred to as a circuit design system) can help a logic designer design and test complex circuits for a system. When a design is complete, the logic design system may be used to generate configuration data for electrically programming the appropriate programmable logic device. The logic design system may be implemented on computing equipment.

As shown in FIG. 6, the configuration data produced by a logic design system 560 may be provided to equipment 540 over a path such as path 580. Equipment 540 provides the configuration data to device 400 so that device 400 can later provide this configuration data to device 10 over path 420. System 560 may be based on one or more computers and one or more software programs. In general, software and data may be stored on any computer-readable medium (storage) in system 560 and is shown schematically as storage 600.

In a typical scenario, logic design system 560 is used by a logic designer to create a custom circuit design. The system 560 produces corresponding configuration data which is provided to configuration device 400. Upon power-up, configuration device 400 and data loading circuitry on device 10 is used to load the configuration data into the programmable memory elements 20 of device 10. Device 10 may then be used in normal operation of system 380.

Figure 7:
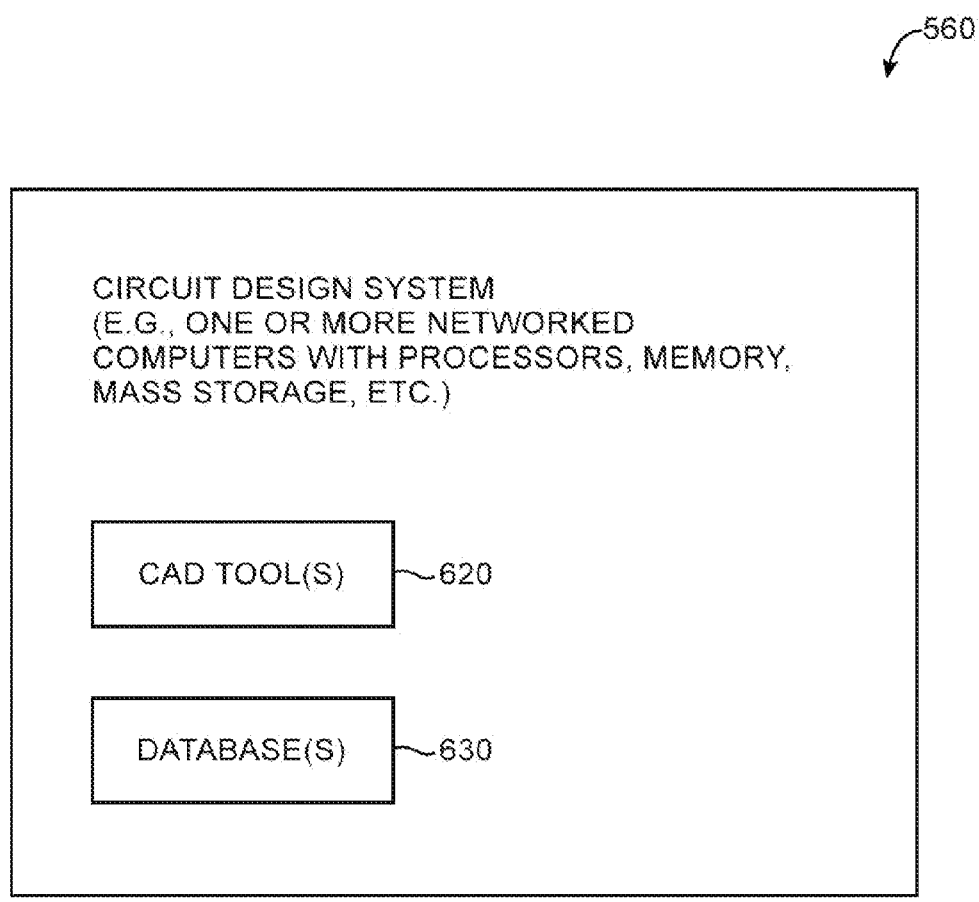
FIG. 7 is a diagram of a logic design system for generating configuration data for implementing custom circuit designs in programmable integrated circuits in accordance with an embodiment of the present invention.

An illustrative logic design system 560 in accordance with the present invention is shown in FIG. 7. System 560 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 620 and databases 630 reside on system 560. During operation, executable software such as the software of computer aided design tools 620 runs on the processor(s) of system 560. Databases 630 are used to store data for the operation of system 560. In general, software and data may be stored on any computer-readable medium (storage) in system 560. Such storage, which is shown schematically as storage 600 of FIG. 6, may include computer memory chips, removable and fixed media such as hard disk drives, flash memory, compact discs (CDs), DVDs, other optical media, and floppy diskettes, tapes, or any other suitable memory or storage device(s). When the software of system 560 is installed, the storage 600 of system 560 has instructions and data that cause the computing equipment in system 560 to execute various methods (processes). When performing these processes, the computing equipment is configured to implement the functions of the logic design system.

The computer aided design (CAD) tools 620, some or all of which are sometimes referred to collectively as a CAD tool, may be provided by a single vendor or multiple vendors. Tools 620 may be provided as one or more suites of tools (e.g., a compiler suite for performing tasks associated with implementing a circuit design in a programmable logic device) and/or as one or more separate software components (tools). Database(s) 630 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Figure 8:
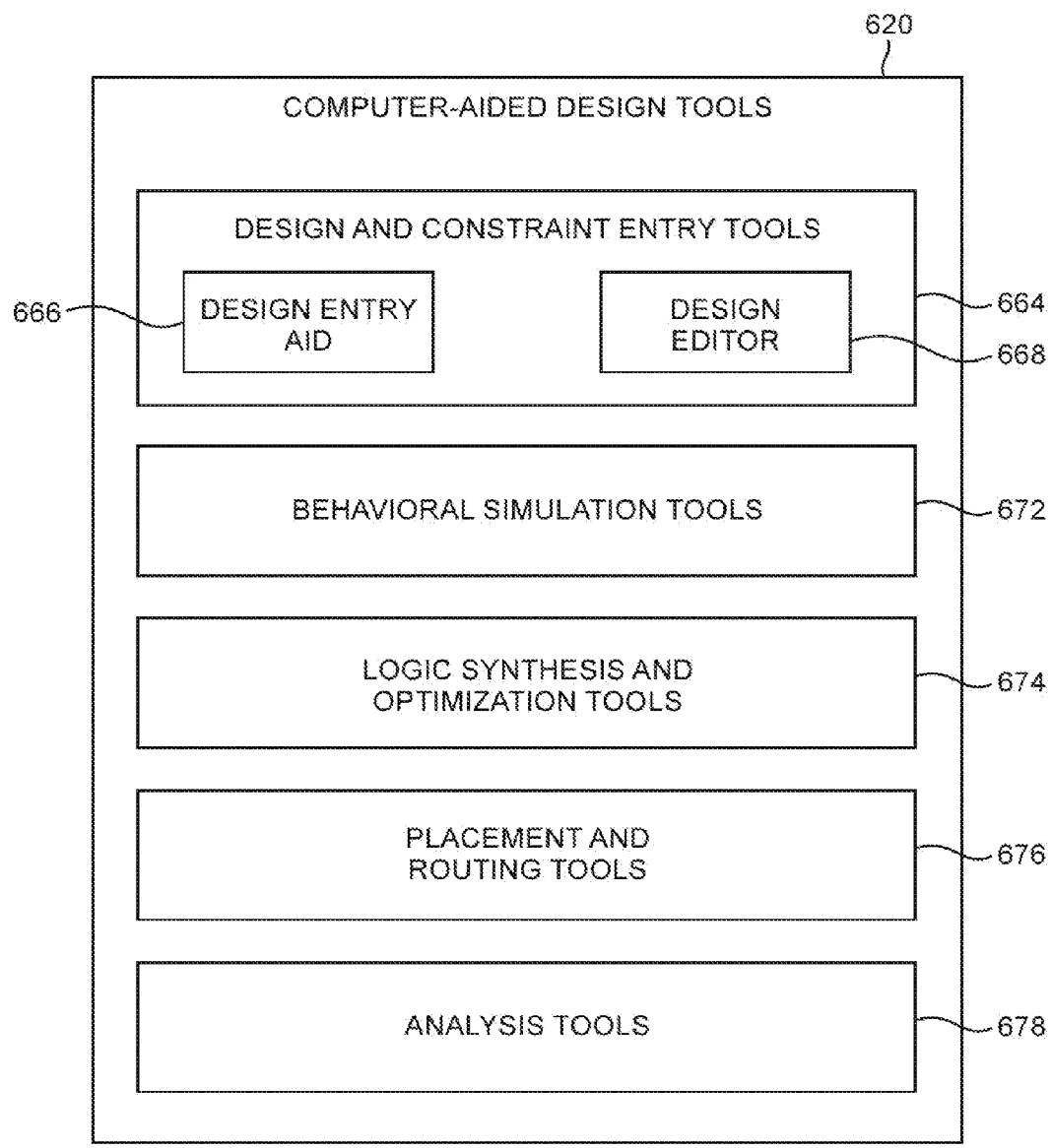
FIG. 8 is a diagram of illustrative computer-aided design (CAD) tools that may be used in a logic design system in accordance with an embodiment of the present invention.

Illustrative computer aided design tools 620 that may be used in a logic design system such as system 560 of FIGS. 6 and 7 are shown in FIG. 8.

The design process typically starts with the formulation of logic circuit functional specifications (e.g., a functional description of the logic circuit). A logic designer can specify how a desired circuit should function using design and constraint entry tools 664. Design and constraint entry tools 664 may include tools such as design and constraint entry aid 666 and design editor 668. Design and constraint entry aids such as aid 666 may be used to help a logic designer locate a desired design from a library of existing logic designs and may provide computer-aided assistance to the logic designer for entering (specifying) the desired design.

As an example, design and constraint entry aid 666 may be used to present screens of options for a user. The user may click on on-screen options to select whether the circuit being designed should have certain features. Design editor 668 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 664 may be used to allow a logic designer to provide a desired logic design using any suitable format. For example, design and constraint entry tools 664 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 664 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 664 may allow the logic designer to provide a logic design to the logic design system 560 using a hardware description language such as Verilog hardware description language (HDL) or Very High Speed Integrated Circuit Hardware Description Language (VHDL). The designer of the logic circuit can enter the logic design by writing hardware description language code with editor 668. Blocks of code may be imported from user-maintained or commercial libraries if desired.

After the design has been entered using design and constraint entry tools 664, behavioral simulation tools 672 may be used to simulate the functional performance of the design. If the functional performance of the design is incomplete or incorrect, the logic designer can make changes to the design using design and constraint entry tools 664. The functional operation of the new design can be verified using behavioral simulation tools 672 before synthesis operations have been performed using tools 674. Simulation tools such as tools 672 may also be used at other stages in the design flow if desired (e.g., after logic synthesis). The output of the behavioral simulation tools 672 may be provided to the logic designer in any suitable format (e.g., truth tables, timing diagrams, etc.).

Once the functional operation of the logic design has been determined to be satisfactory, logic synthesis and optimization tools 674 may be used to implement the logic design in a particular programmable logic device (i.e., in the logic and interconnect resources of a particular programmable logic device product or product family).

Tools 674 attempt to optimize the design by making appropriate selections of hardware to implement different logic functions in the logic design based on the logic design data and constraint data entered by the logic designer using tools 664.

After logic synthesis and optimization using tools 674, the logic design system may use tools such as placement and routing tools 676 to perform physical design steps (layout synthesis operations). Placement and routing tools 676 are used to determine how to place the circuits for each logic function within the programmable logic device. For example, if two counters interact with each other, the placement and routing tools 676 may locate these counters in adjacent logic regions on the programmable logic device to reduce interconnect delays or to satisfy timing requirements specifying the maximum permitted interconnect delay. The placement and routing tools 676 create orderly and efficient implementations of logic designs for a given programmable logic device.

Tools such as tools 674 and 676 may be part of a compiler suite (e.g., part of a suite of compiler tools provided by a programmable logic device vendor). In accordance with the present invention, tools such as tools 674, 676, and 678 automatically take into account the effects of crosstalk between interconnects while implementing a desired circuit design. Tools 674, 676, and 678 may also include timing analysis tools. This allows tools 674 and 676 to satisfy performance requirements (e.g., timing requirements) when generating configuration data for programming integrated circuits such as programmable integrated circuit 10.

After an implementation of the desired logic design in the programmable logic device has been generated using placement and routing tools 676, the implementation of the design may be analyzed and tested using analysis tools 678. After satisfactory optimization operations have been completed using tools 620, tools 620 can produce the configuration data for the programmable logic device.

Figure 9:
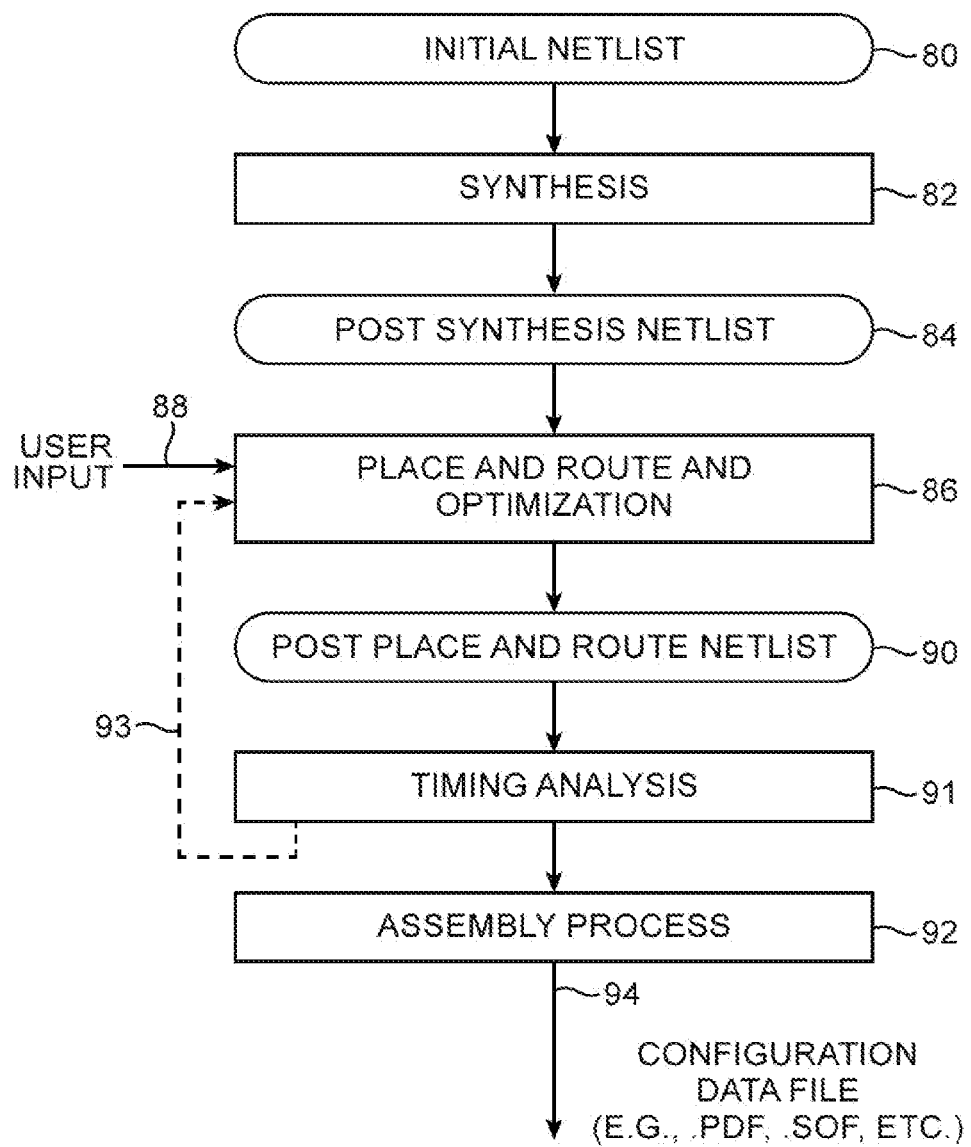
FIG. 9 is a flow chart of illustrative steps for designing a custom logic circuit and performing timing analysis in accordance with an embodiment of the present invention.

Illustrative operations involved in using tools 620 of FIG. 8 to produce configuration data files are shown in FIG. 9. As shown in FIG. 9, an initial netlist 80 is synthesized at step 82 to produce a post-synthesis netlist 84. At step 86, user input 88 and the post synthesis netlist 84 are processed during place and route and optimization operations. During the operations of step 86, the CAD tools 620 take account of the effects of using different positive power supply voltages and/or body bias voltages and, through appropriate selection of power supply and body bias levels, circuit resource assignments, and placement decisions, tools 62 reduce power consumption while satisfying design constraints.

The resulting netlist 90 may be processed further by performing a timing analysis using logic design system 560 (step 91). The timing analysis may be used to help ensure that the final netlist 90 satisfies timing constraints before configuring programmable integrated circuit 10. If desired, processing may optionally loop back to step 86 via path 93 to perform additional optimizations using the final netlist. For example, logic design system 560 may identify routing paths in the final netlist that fail timing constraints and determine replacement routing paths by returning to step 86 via optional path 93.

At step 92, the final netlist may be processed further during an assembly process to produce a configuration data file output (e.g., a .pof or .sof file). The configuration data file output may then be loaded onto programmable device 10.

Figure 10:
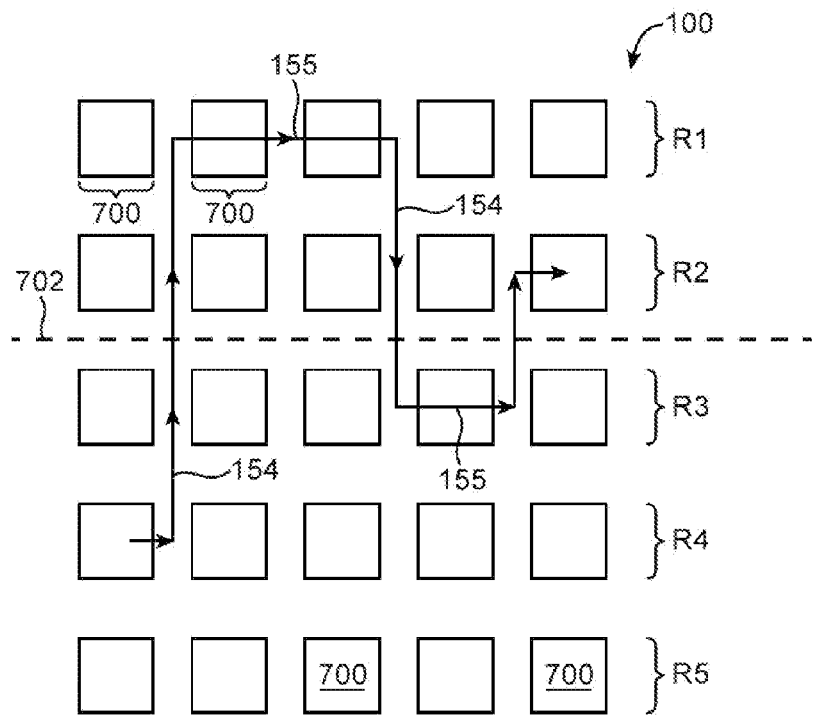
FIG. 10 is a diagram showing an illustrative intra-region critical routing path in accordance with an embodiment of the present invention.

In general, it may be desirable to use tools 620 to identify a most critical routing path on device 10 (e.g., a routing path with the maximum propagation delay in region 100) and to determine whether signals propagating along that critical path satisfy design criteria. FIG. 10 is a diagram showing an illustrative continuous routing path (e.g., a routing path that propagates a user signal originating from a single logic source via multiplexers 150 interposed in that path). As shown in FIG. 10, repairable region 100 includes five logic rows R1-R5 each of which includes five logic blocks 700. A critical path in region 100 may be obtained by identifying a row with a maximum number of vertical routing segments 154 communicating with any adjacent row (i.e., by identifying a pair of adjacent rows with the maximum number of vertical wire crossings).

In the example of FIG. 10, the critical routing path may originate from row R4 and be routed to R1 via three vertical line segments 154, through two logic blocks in row R1 via horizontal line segments 155, back down to row R3 via two additional vertical line segments 154, and back up to row R2. This particular critical routing path exhibits two U-turns, resulting in three vertical routing segments 154 (i.e., vertical wires 154 interposed in the critical routing path) traversing row boundary 702 (i.e., a boundary separating row R2 and R3). Row boundary 702 exhibiting a maximum number of vertical wire crossings in the critical routing path may be referred to as a critical row boundary.

Figure 11:
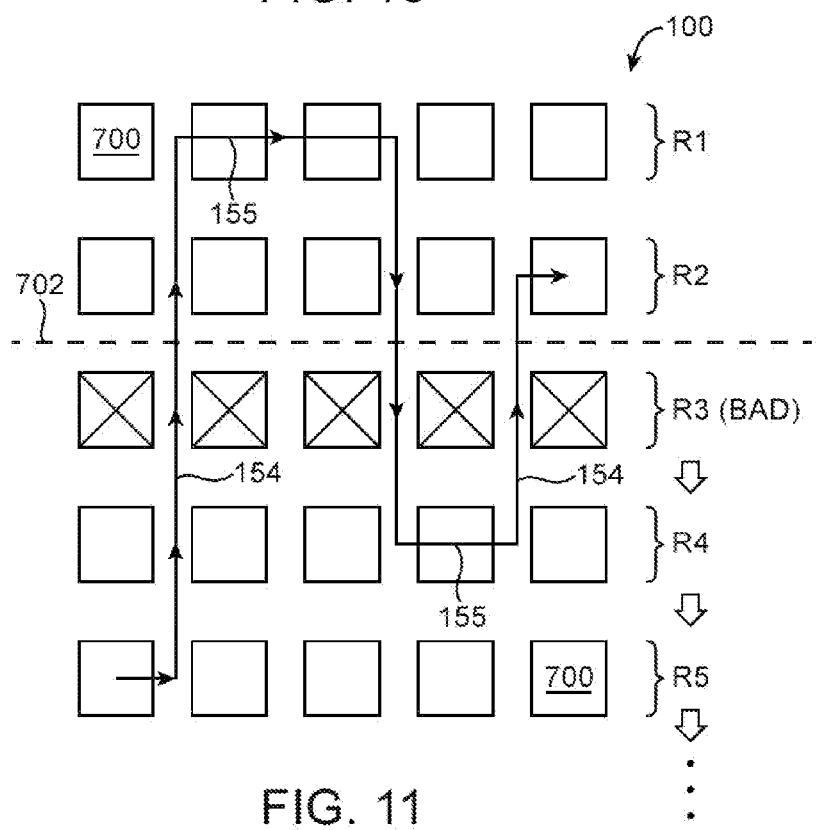
FIG. 11 is a diagram illustrating a worst case scenario associated with the critical routing path of FIG. 10 in accordance with an embodiment of the present invention.

FIG. 11 shows the worst case scenario in which row R3 that is adjacent to critical row boundary 702 is the defective row. In this scenario, each row below the bad row has to be shifted down by one row using the bypassing scheme previously described in connection with FIG. 4. Bypassing a row in this way will introduce an additional multiplexer/driver and wire delay for each time the critical path traverses boundary 702. As shown in FIG. 11, timing analysis 91 will have to take into account propagation delay associated with three additional multiplexers 150, drivers 152, and vertical routing segments 154 (sometimes referred to collectively as one unit of vertical routing delay) when determining whether region 100 satisfies performance criteria. In general, each additional U-turn in a critical ground can potentially result in up to one extra unit of vertical routing delay when performing conservative timing analysis.

Figure 12:
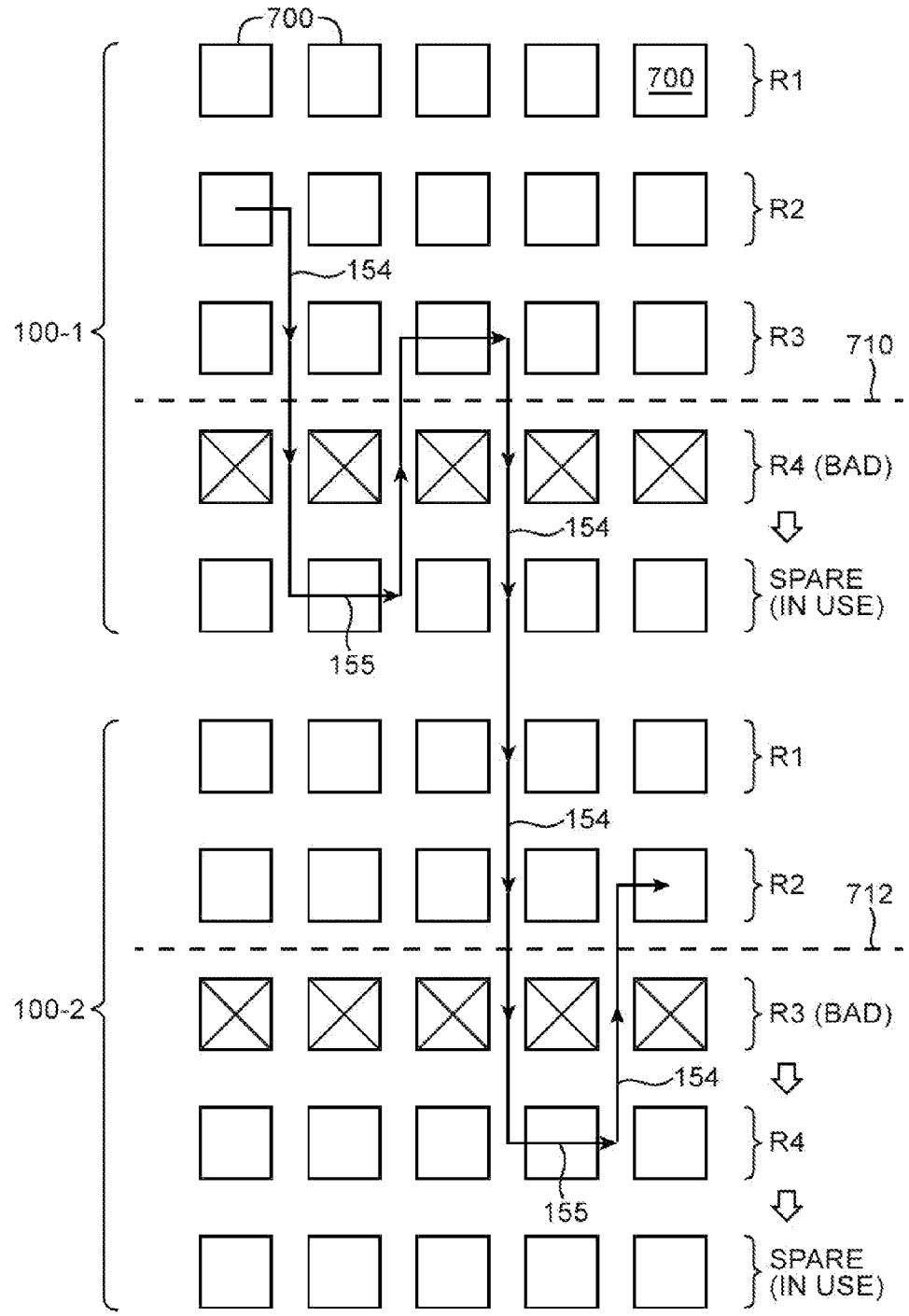
FIG. 12 is a diagram illustrating a worst case scenario associated with a inter-region critical routing path in accordance with an embodiment of the present invention.

For devices that include more than one repairable region 100, it is possible for signals to cross between adjacent repairable regions 100. FIG. 12 shows a worst case scenario in which an inter-region critical path traverses a defective row that is adjacent to a first critical row boundary 710 in a first repairable region 100-1 and traverse another defective row that is adjacent to a second critical row boundary 712 in a second repairable region 100-2 neighboring first region 100-1.

In other words, when performing conservative timing analysis for inter-region critical paths, tools 620 may be used to identify the maximum number of vertical wire crossings between a first pair of adjacent rows in first region 100-1 and to identify the maximum number of vertical wire crossings between a second pair of adjacent rows in second region 100-2 (e.g., to identify the number of vertical wire crossings at the critical row boundary in every region 100 that the critical path traverses). Each time the critical path traverses a critical row boundary, an additional unit of vertical routing delay may be incurred to take into account worst case scenario that the row following the critical row boundary is defective. The worst case timing delay can therefore be determined by separately computing the worst case delay for each region that includes the critical path, and then subsequently summing the separately computed delay to obtain the total worst case delay for the inter-region critical path. This approach of computing worst case delay for inter-region critical paths may be extended to calculating the worst case delay for critical paths traversing three or more repairable regions, five or more repairable regions, 10 or more repairable regions, etc.

The examples of FIGS. 10-12 are merely illustrative and do not serve to limit the scope of the present invention. In general, each region 100 may be configured to include a critical routing path that traverses a row boundary any suitable number of times while other inter-region critical routing paths may cross region boundaries any suitable number of times.

Figure 13:
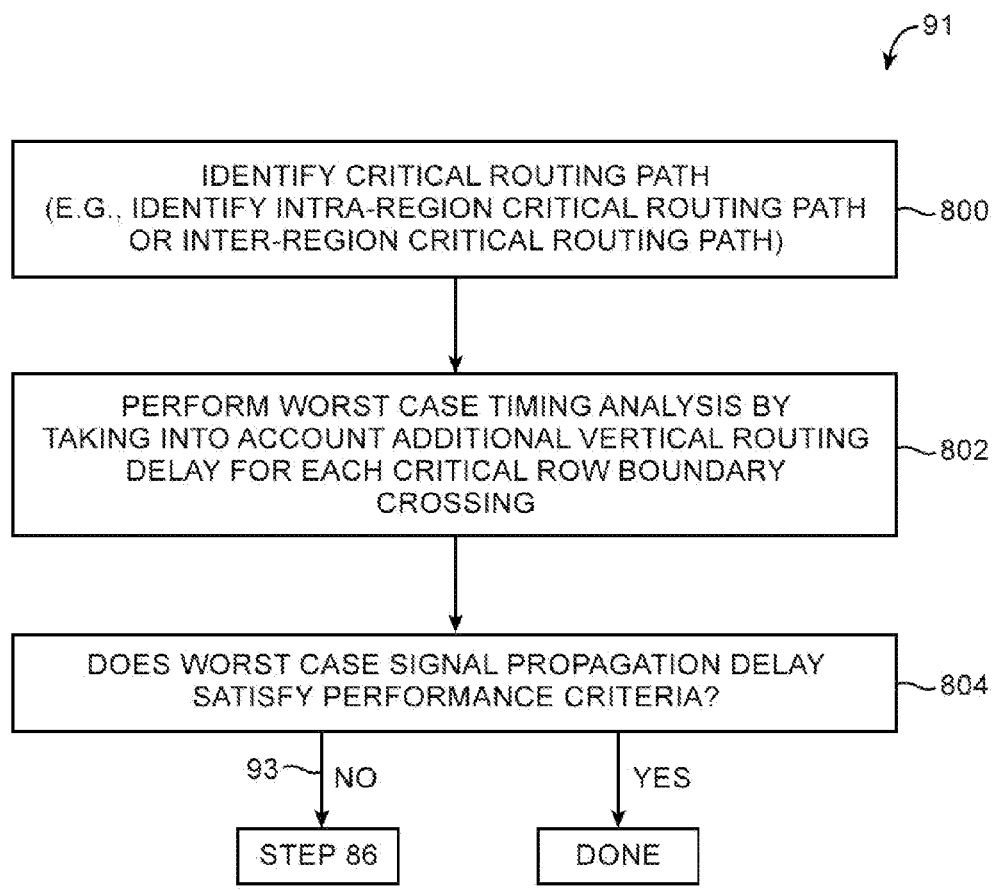
FIG. 13 is a flow chart of illustrative steps involved in performing timing analysis in accordance with an embodiment of the present invention.

FIG. 13 is a flow chart of illustrative steps involve in performing timing analysis 91. At step 800, tools 620 may be used to identify an intra-region critical routing path in each region 100 (i.e., a critical routing path that performs signal routing within a single repairable region 100 as described in connection with FIGS. 10 and 11) and may be used to identify inter-region critical routing paths on device 10 (i.e., critical routing paths that performs signal routing among neighboring repairable regions 100 as described in connection with FIG. 12).

At step 802, tools 620 may perform worst case timing analysis on the identified critical paths by identifying a critical row boundary that separates a pair of adjacent rows having the maximum number of vertical wire crossings. Each critical row boundary crossing may incur one additional unit of vertical routing delay (to take into account the scenario in which the row following the critical row boundary is defective).

At step 804, tools 620 may determine whether the signal propagation associated with each identified critical routing path while taking into account the additional routing delay satisfies performance criteria. If the worst case signal propagation delay is acceptable, timing analysis is complete. If the worst case signal propagation delay fails to meet design criteria, processing may proceed to step 86 to perform further design optimizations (see, FIG. 9) that can potentially help to reduce the worst case delay.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
    a logic region having a plurality of rows of circuitry including a spare row of circuitry;
    a plurality of routing segments each of which has a first end coupled to a respective one of the rows of circuitry and an opposing second end coupled to an adjacent one of the rows of circuitry; and
    a plurality of bypass circuits each of which is coupled between a respective pair of the routing segments, wherein the bypass circuits are operable to switch the spare row into use when one of the rows of circuitry contains a defective circuit, wherein each routing segment is operable to be driven by an associated routing segment using a respective one of the bypass circuits, wherein the plurality of bypass circuits comprises a plurality of multiplexers, and wherein each multiplexer in the plurality of multiplexers includes a first input operable to receive user signals, a second input that is coupled to one associated routing segment, and an output that is coupled to another associated routing segment.

2. The integrated circuit defined in claim 1, wherein the logic region comprises a programmable logic region.

3. The integrated circuit defined in claim 1, wherein the plurality of bypass circuits comprises a plurality of multiplexers.

4. The integrated circuit defined in claim 1, further comprising:
    a plurality of driver circuits each of which is coupled to the output of a respective one of the multiplexers.

5. An integrated circuit, comprising:
    a logic region having a plurality of rows of circuitry including a spare row of circuitry;
    a plurality of routing segments each of which has a first end coupled to a respective one of the rows of circuitry and an opposing second end coupled to an adjacent one of the rows of circuitry;
    a plurality of bypass circuits each of which is coupled between a respective pair of the routing segments, wherein the bypass circuits are operable to switch the spare row into use when one of the rows of circuitry contains a defective circuit, and wherein each routing segment is operable to be driven by an associated routing segment using a respective one of the bypass circuits; and
    a plurality of fuse-based storage elements operable to control the plurality of bypass circuits.

6. An integrated circuit, comprising:
    a logic region having a plurality of rows of circuitry including a spare row of circuitry;
    a plurality of routing segments each of which has a first end coupled to a respective one of the rows of circuitry and an opposing second end coupled to an adjacent one of the rows of circuitry; and
    a plurality of bypass circuits each of which is coupled between a respective pair of the routing segments, wherein the bypass circuits are operable to switch the spare row into use when one of the rows of circuitry contains a defective circuit, wherein each routing segment is operable to be driven by an associated routing segment using a respective one of the bypass circuits, wherein the spare row of circuitry in the logic region is formed within a given height, and wherein each routing segment in the plurality of routing segments has a length that is at most equal to the given height.

7. An integrated circuit, comprising:
    a logic region having a plurality of rows of circuitry including a spare row of circuitry;
    a plurality of routing segments each of which has a first end coupled to a respective one of the rows of circuitry and an opposing second end coupled to an adjacent one of the rows of circuitry;
    a plurality of bypass circuits each of which is coupled between a respective pair of the routing segments, wherein the bypass circuits are operable to switch the spare row into use when one of the rows of circuitry contains a defective circuit, and wherein each routing segment is operable to be driven by an associated routing segment using a respective one of the bypass circuits;
    an additional logic region having another plurality of rows of circuitry including another spare row of circuitry; and
    an additional routing segment having a first end coupled to a first bypass circuit in the spare row of circuitry in the logic region and an opposing second end coupled to a second bypass circuit in a selected row of circuitry in the additional logic region, wherein the spare row of circuitry in the logic region is adjacent to the selected row of circuitry in the additional logic region.

8. A method of manufacturing an integrated circuit having a plurality of rows of logic circuitry including a spare row of logic circuitry, a plurality of routing segments each of which has a first end that is coupled to a respective one of the rows of logic circuitry and a second end that is coupled to an adjacent one of the rows of logic circuitry, and a plurality of bypass circuits each of which is coupled between a respective pair of routing segments, wherein each bypass circuit includes a first input operable to receive user signals, a second input that is coupled to one associated routing segment in the plurality of routing segments, and an output that is coupled to another associated routing segment in the plurality of routing segments, the method comprising:

determining whether at least one of the plurality of rows of logic circuitry contains a defective circuit; and in response to determining that a selected row of logic circuitry in the plurality of rows of logic circuitry is defective, switching the spare row of logic circuitry into use and bypassing the defective row of logic circuitry by configuring the bypass circuit in the defective row to route signals from its second input to its output.

9. The method defined in claim 8, further comprising:

in response to determining that at least two rows in the plurality of rows of logic circuitry contain defective circuits, discarding the integrated circuit.

10. The method defined in claim 8, further comprising:

determining whether the selected row of logic circuitry contains a defective bypass circuit; and in response to determining that the bypass circuitry in the selective row of logic circuitry is defective, discarding the integrated circuit.

11. The method defined in claim 8, further comprising:

in response to determining that each of the rows in the plurality of rows of logic circuitry is free of defects, configuring the spare row of logic circuitry in idle mode.

12. The method defined in claim 8, wherein configuring the bypass circuit in the defective row comprises blowing a fuse-based memory element that is coupled to that bypass circuit.

13. The method defined in claim 8, wherein the plurality of bypass circuits comprises a plurality of multiplexing circuits.

14. The method defined in claim 8, wherein the spare row of logic circuitry has a given height, wherein the plurality of routing segments comprises a plurality of signal routing paths each of which has first and second terminals, and wherein the first and second terminals of each signal routing path are separated by a distance that is less than the given height.

15. The method defined in claim 13, wherein the integrated circuit further includes:

an additional plurality of multiplexing circuits, wherein each multiplexing circuit in the additional plurality of multiplexing circuits has a first input that is coupled to a respective one of the routing segments and a second input; and an additional plurality of routing segments each of which has a first end that is coupled to the second input of a respective one of the additional multiplexing circuits that is formed in a respective one of the rows of logic circuitry and a second end that is coupled to a non-adjacent one of the rows of logic circuitry.

16. A method of operating an integrated circuit, wherein the integrated circuit includes a logic region having a plurality of rows of circuitry including a spare row of circuitry, wherein the integrated circuit further includes a plurality of routing segments each of which has a first end coupled to a respective one of the rows of circuitry and an opposing end coupled to an adjacent one of the rows of circuitry, and wherein the integrated circuit further includes an additional logic region having another plurality of rows of circuitry include another spare row of circuitry, the method comprising:

with a plurality of bypass circuits each of which is coupled between a respective pair of the routing segments, switching the spare row into use when one of the rows of circuitry contains a defective circuit;

driving each routing segment with an associated routing segment using a respective one of the bypass circuits; and with an additional routing segment, receiving signals from a first bypass circuit in the spare row of circuitry in the logic region and routing the received signals to a second bypass circuit in a selected row of circuitry in the additional logic region, wherein the spare row of circuitry in the logic region is adjacent to the selected row of circuitry in the additional logic region.

17. The method defined in claim 16, wherein the plurality of bypass circuits comprises a plurality of multiplexing circuits.

18. The method defined in claim 16, wherein the spare row of circuitry in the logic region is formed within a given height, and wherein the additional routing segment has a length that is at most equal to the given height.

\* \* \* \* \*